United States Patent [19]

Cote et al.

[11] Patent Number: 5,753,303
[45] Date of Patent: May 19, 1998

[54] PROCESS FOR THE ELIMINATION OF TUNGSTEN OXIDATION WITH INERT GAS STABILIZATION IN CHEMICAL VAPOR DEPOSITION PROCESSES

[75] Inventors: Donna Rizzone Cote; William Joseph Cote; Donna Diane Miura; Christopher Joseph Waskiewicz, all of Dutchess County, N.Y.

[73] Assignee: International Business Machines Corporation, Armonk, N.Y.

[21] Appl. No.: 640,307

[22] Filed: Apr. 30, 1996

[51] Int. Cl.[6] .................................................. C23C 16/40
[52] U.S. Cl. .................. 427/248.1; 427/255; 427/255.3; 427/255.7
[58] Field of Search .................. 427/99, 124, 248.1, 427/255, 255.3, 255.7

[56] References Cited

U.S. PATENT DOCUMENTS

| | | | |
|---|---|---|---|
| 4,357,179 | 11/1982 | Adams et al. | 148/1.5 |
| 4,513,026 | 4/1985 | Miyamoto et al. | 427/85 |
| 4,619,840 | 10/1986 | Goldman et al. | 427/91 |
| 4,726,961 | 2/1988 | Diem et al. | 437/245 |
| 4,849,260 | 7/1989 | Kusumoto et al. | 427/250 |
| 4,895,770 | 1/1990 | Schintlmeister et al. | 428/552 |
| 4,994,301 | 2/1991 | Kusumoto et al. | 427/56.1 |
| 5,254,369 | 10/1993 | Arai et al. | 427/248.1 |
| 5,354,387 | 10/1994 | Lee et al. | 148/33.3 |
| 5,387,438 | 2/1995 | Werner et al. | 427/253 |
| 5,407,698 | 4/1995 | Emesh | 427/99 |

*Primary Examiner*—Benjamin Utech
*Assistant Examiner*—Timothy Meeks
*Attorney, Agent, or Firm*—Daryl K. Neff, Esq.; Whitham, Curtis, Whitham & McGinn

[57] ABSTRACT

An inert gas, such as helium, nitrogen, or argon, is used for pressurization and stabilization in a chemical vapor deposition process that occurs in an ambient temperature in excess of 400° C. Using the inert gas in the pressurization and stabilization stages of the chemical vapor deposition process eliminates the formation of tungsten oxides on tungsten studs, lines and other devices in the substrate, thereby eliminating the variable contact resistance and other problems associated with tungsten oxides.

6 Claims, 5 Drawing Sheets

PROCESS FOR THE ELIMINATION OF TUNGSTEN OXIDATION WITH INERT GAS STABILIZATION IN CHEMICAL VAPOR DEPOSITION PROCESSES

DESCRIPTION

BACKGROUND OF THE INVENTION

1. Field of the Invention

The invention is generally related to chemical vapor deposition processes used in the manufacture of integrated circuit chips, wafers, and other devices which utilize tungsten studs, metal lines, and other tungsten elements and, more particularly, to processes for stabilizing the pressure in the chemical vapor deposition chamber in a manner which prevents oxidation of the tungsten elements, yet still ensures that the substrate produced will be reliable.

2. Description of the Prior Art

Chemical vapor deposition (CVD) broadly encompasses all processes of reacting two or more chemical species in vapor phase, and depositing the entity which is formed onto a substrate. CVD processes are widely used in the integrated circuit manufacturing field for the formation of layers or other structures on chips, wafers, and other devices. In most CVD processes, reactants are flowed into a reaction chamber using gas or liquid lines, and the conditions inside the chamber are adjusted to proper temperatures and pressures to assure that the reactant species remain in the gaseous phase until they react and are deposited on the substrate. In some CVD processes, the reactant species can be delivered inside the chamber using an inert gas such as helium as a carrier gas. Two types of CVD processes which have been used in the manufacture of integrated circuit substrates include plasma enhanced chemical vapor deposition (PECVD) and subatmospheric chemical vapor deposition (SACVD). In PECVD, oxygen gas is used to form the oxidant species in the plasma inside the chamber which causes the vapor phase reaction between one or more reactant species. In SACVD, ozone is used as the oxidant.

In CVD processes, the pressure conditions within the chamber must be tightly regulated. Fluctuations in the chamber pressure result in deposition rate variation and thus inconsistent thickness and poor film thickness uniformity. This result is deleterious to substrate performance and should be avoided. Fluctuations in chamber pressure are known to occur when reactant species are introduced into the chamber. It is common practice to stabilize the chamber pressure against fluctuations by introducing a first reactant species into the chamber using a gaseous carrier or by other means at the time the chamber pressure has been optimized for deposition, and subsequently introducing the second reactant species after stabilization with the first reactant species. In operation in prior systems and methodologies for PECVD and SACVD, oxygen or a mixture of oxygen and an inert gas is used to ramp up the pressure inside the chamber, and then the first reactant species is introduced into the deposition chamber using helium as a carrier gas and stabilized. After deposition of a layer or other structure on a substrate, the pressure inside the deposition chamber must again be carefully ramped down to avoid formation of particulates. In PECVD and SACVD processes, the oxygen or ozone gas is typically used during the ramp down period after deposition.

SUMMARY OF THE INVENTION

It is an object of this invention to provide a process for pressurizing and stabilizing a CVD chamber, particularly one used in PECVD or SACVD where reactant temperatures inside the chamber exceed 400° C., which uses a non-oxygen containing gas to both pressurize and stabilize a reactant species within the CVD chamber, thereby avoiding oxidation of tungsten studs, lines, and other devices in a substrate on which a layer or other device is to be deposited.

It is another object of this invention to provide a process for using SACVD to deposit phosphosilicate glass (PSG), boron phosphosilicate glass (BPSG), undoped glass, and other layers or structures which utilize boron or phosphorous, at high temperatures on a substrate which includes tungsten studs, lines, and other devices.

According to the invention, it has been discovered that tungsten will oxidize when it is exposed to an ambient that contains oxygen (e.g., pure oxygen, or oxygen mixed with an inert gas such as helium, nitrogen, or argon) at temperatures above 400° C. The tungsten oxide which is formed results in a large contact resistance distribution which becomes a reliability concern in integrated circuit manufacturing since only marginal contact is made. Devices formed with tungsten oxide may either fail immediately, where contact opens exist due to thick tungsten oxide deposits, or may fail after repeated use during an extended period of time. In addition, tungsten oxidation of the chip perimeter line that functions as a guard ring can be a reliability problem since that ring serves as an ionic barrier and tungsten oxide would make that barrier discontinuous. Finally, good contact resistance from one tungsten level to the next for the guard ring is a requirement, and tungsten oxide would degrade this contact resistance. This invention overcomes these difficulties by using an inert gas, which is preferably helium, argon, or nitrogen, to pressurize a deposition chamber and stabilize reactant species within the deposition chamber, when a substrate including tungsten studs, lines or other devices is to be coated with a layer or other structure via CVD at temperatures in excess of 400° C.

BRIEF DESCRIPTION OF THE DRAWINGS

The foregoing and other objects, aspects and advantages will be better understood from the following detailed description of the preferred embodiments of the invention with reference to the drawings, in which.

DETAILED DESCRIPTION OF THE PREFERRED EMBODIMENTS OF THE INVENTION

It has been discovered that oxidation occurs when tungsten is exposed to an ambient that is either entirely oxygen or comprised of a mixture of oxygen and an inert gas such as nitrogen, helium or argon, when the ambient temperature is in excess of 400° C. This discovery was made when a mixture of oxygen and helium was used to pressurize the deposition chamber of an AME 5000, available from Applied Materials Corporation, from base pressure to 600 Torr in preparation of SACVD of PSG. As discussed above, tungsten oxide formation hinders the performance of integrated circuit chips, wafers and other devices. For example, the tungsten oxide can result in open contacts if thick tungsten oxide is formed, a large contact resistance distribution can result which leads to a reliability problem over time after repetitive use, and guard rings formed of tungsten will not provide a reliable ionic barrier since tungsten oxide would make that barrier discontinuous.

The solution to the problem was to replace the mixture of inert gas that is used to pressurize prior to SACVD PSG deposition with helium only. Helium was used in the process because of the availability of this gas on the AME 5000 tool. However, other inert gases such as nitrogen or argon can be used as well, as long as there is no oxygen present. Therefore, in the practice of this invention, the stabilization gas must be high purity, i.e., not house grade where a small percentage of oxygen is allowed. Best results are obtained when the inert gas has a purity of greater than 99.99%.

The use of an inert gas for pressurization and stabilization in the CVD chamber eliminates tungsten oxidation without the need of reducing the process temperature. Reduction in process temperature for the helium/oxygen stabilization would help to lower the rate of tungsten oxidation, but the lower temperature is detrimental to the SACVD PSG gap filling capability. At higher temperatures, the SACVD PSG gap fill is better, and voids in the PSG will cause yield loss (for example: due to bit-line-to-bit-line shorts (BL-to-BL)). Therefore, the change to helium only pressurization and stabilization does not change the actual deposition process, and the resulting PSG films are equivalent for both stabilizations (helium only or oxygen/helium mix). While PSG coatings were formed in this example, it should be understood that other films can be deposited by CVD (i.e., SACVD or PECVD) using high ambient temperatures (e.g., BPSG, undoped glass, and other boron or phosphorous glass layers) and that the process of using an inert gas to pressurize and stabilize the deposition chamber will be equally useful in these processes.

Figure 1:
FIG. 1 is a scanning electron micrograph (SEM) of tungsten studs that have been exposed to a mixture of helium and oxygen for approximately 1 minute at 480° C. showing that tungsten oxide is present.
Figure 2:
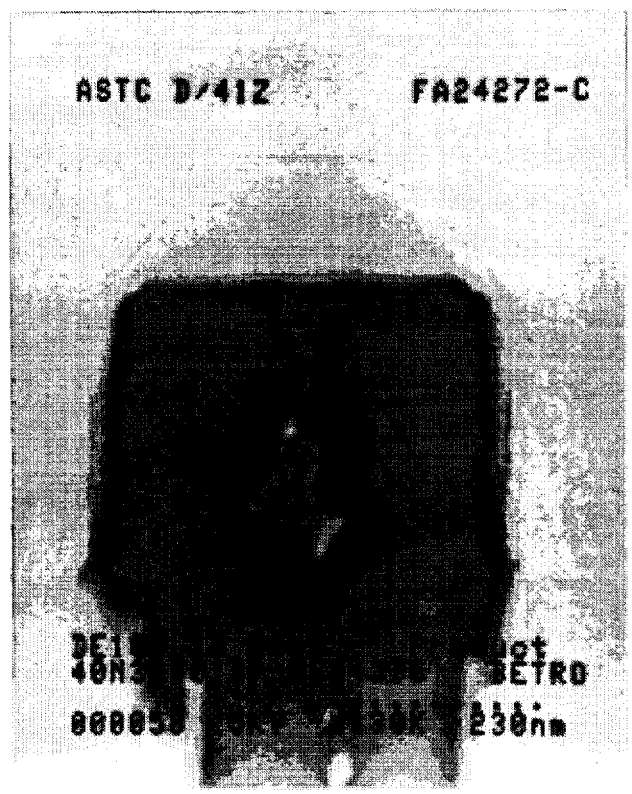
FIG. 2 is an SEM showing tungsten studs after exposure to a helium-only stabilization for approximately 1 minute at 480° C.
Figure 3:
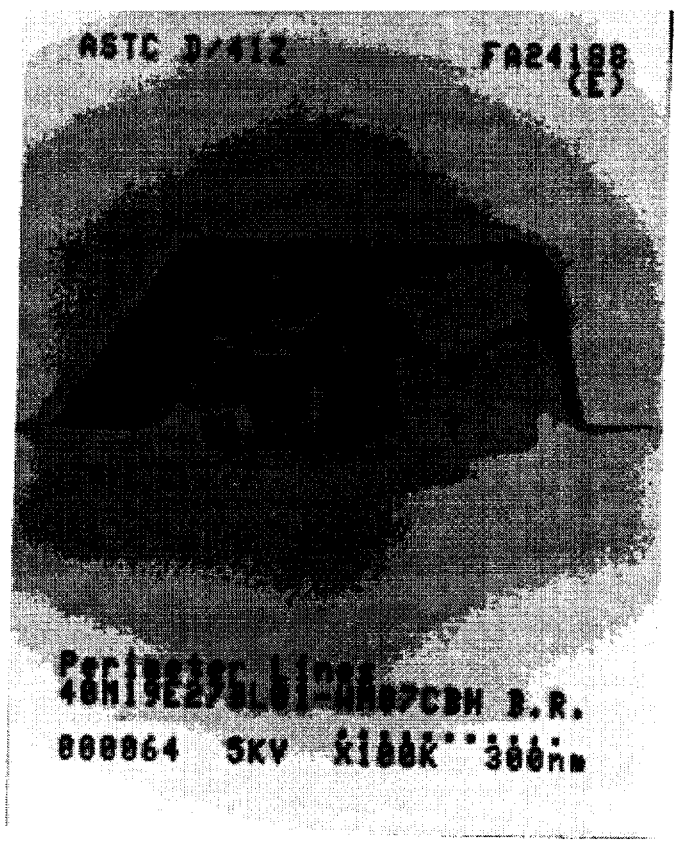
FIG. 3 is an SEM showing the tungsten perimeter lines after approximately three minutes (180 secs) stabilization at 480° C. showing that approximately 500 Å of tungsten oxide formed.
Figure 4B:
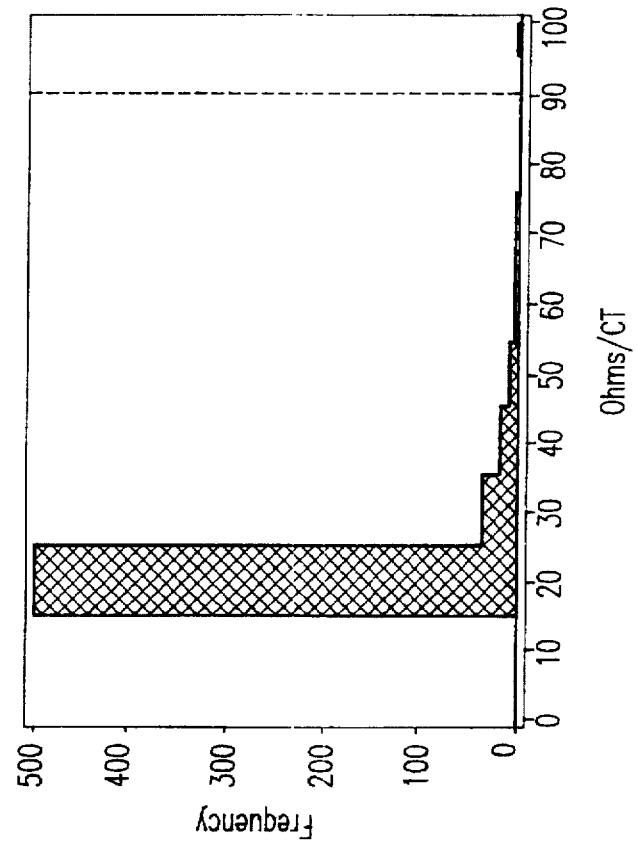
FIG. 4b is a graph showing the typical distribution of 1 lot processed with the oxygen and helium stabilization.
Figure 4A:
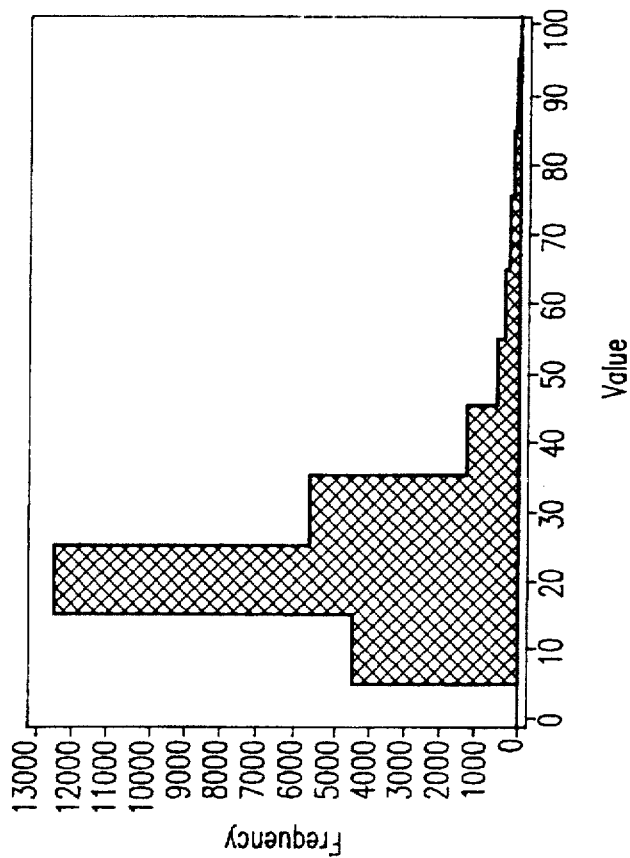
FIG. 4a is a graph showing the contact resistance data from 44 lots that were run during the time frame when the oxygen and helium mixture were used during stabilization.
Figure 4D:
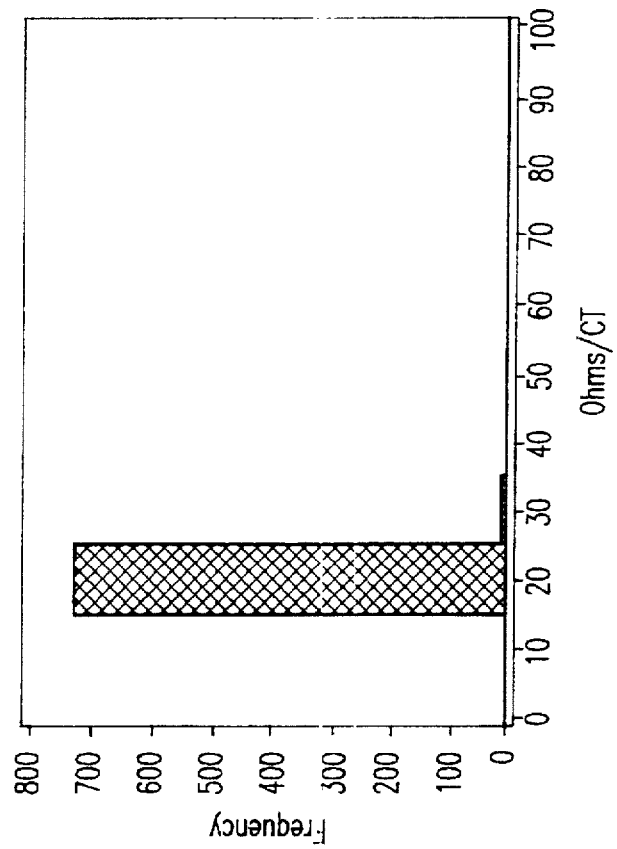
FIGS. 4c and 4d are graphs showing two lots processed with helium only stabilization.
Figure 4C:
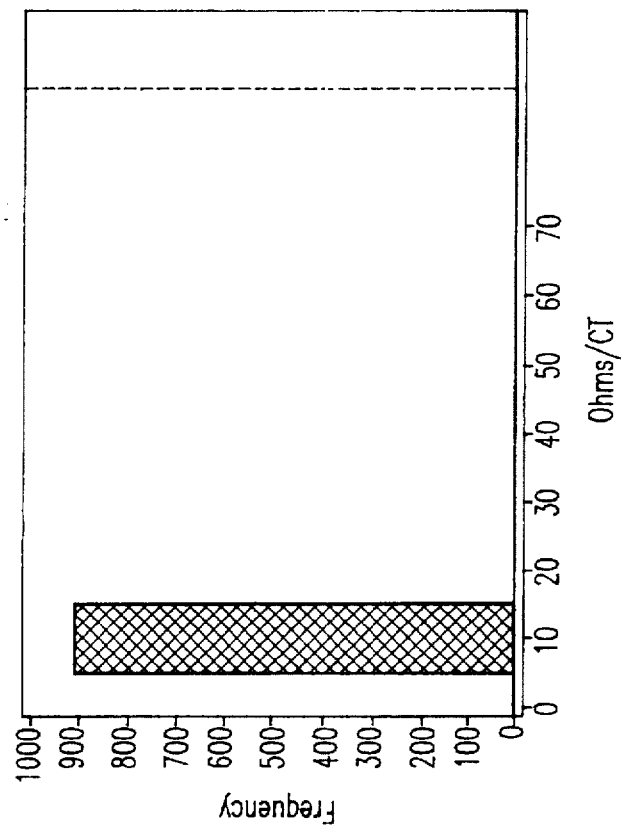

FIG. 1 shows tungsten oxide formed on tungsten studs that have been exposed to a mixture of helium and oxygen for approximately 1 minute at 480° C. In sharp contrast, FIG. 2 shows tungsten studs after exposure to helium-only pressurization and stabilization for the same amount of time at 480° C., where there is no tungsten oxide present. FIG. 3 shows tungsten perimeter lines after 180 seconds oxygen/helium stabilization (no deposition) at 480° C. About 500 Å of tungsten oxide was formed. FIGS. 4a–d illustrate the improvement in contact resistance which results with the elimination of oxygen in the stabilization. FIG. 4a shows contact resistance data from forty four lots that were run during the timeframe when the oxygen and helium mixture was used during stabilization. FIG. 4b shows a typical distribution for one lot processed with the oxygen and helium stabilization. FIGS. 4c and 4d are two lots processed with helium only stabilization. It should be noted by one of ordinary skill in the art that there is no "tail" present in the contact resistance data for the helium-only lots compared to the oxygen and helium lot (FIG. 4b).

This invention contemplates the use of an inert gas for both pressurization and stabilization of a CVD chamber having an ambient temperature in excess of 400° C. to prevent tungsten oxide formation and can be used in both PECVD and SACVD processes. For exemplary purposes only, a process for pressurizing and stabilizing a chamber in an SACVD PSG process at 480° C. is discussed below; however, it should be understood that the process of this invention could be practiced for the formation of other layers and/or structures on a substrate. Furthermore, the pressure of 600 Torr specified below for the SACVD PSG process is a matter of design choice and could be varied within the practice of this invention. For example, the inert gas could be used to pressurize and stabilize reactants at pressures up to 760 Torr.

Pressurization and Stabilization with an Inert Gas

After a substrate to be coated by PECVD or SACVD is inserted into the CVD chamber, the chamber is pressurized using an inert gas (helium, nitrogen, argon, etc.) which is flowed into the chamber using a gas line. When the pressure inside the chamber approaches a desired level, one of the reactants is introduced into the chamber using the inert gas as a carrier. In the SACVD of PSG on a substrate, the desired pressure in the chamber is 600 Torr, and the reactants are triethylphosphate (TEPO) dopant and tetraethoxysilane (TEOS) as the silicon source. Ozone is used as the oxidant. The deposition temperature ideally occurs at temperatures in excess of 400° C. (e.g., 480° C.) to assure optimum gap filling by the deposited PSG. Thus, for example, when the pressure inside the chamber approaches 600 Torr, the TEOS reactant is introduced into the deposition chamber using the liquid line. Pressurization and stabilization ordinarily takes 1–2 minutes total time. Use of helium or another inert gas during the pressurization and stabilization processes prevents the formation of a tungsten oxide layer on tungsten studs, lines, or other structures in the substrate. For deposition of PSG to begin, the ozone oxidant is turned on and introduced into the chamber, the TEPO dopant is turned on and introduced into the chamber, and the helium (or other inert) gas is turned off. The ozone catalyzes a reaction between the TEPO and TEOS to form the PSG. Upon the conclusion of depositing a PSG layer, the TEOS and TEPO are turned off and the pressure in the chamber is ramped down according to a preset schedule. As discussed above, the ramp down cannot occur abruptly since PSG particulates would be deposited on the substrate surface. In the AME 5000 tool, ozone and oxygen gases are used in the ramp down period; however, inert gases such as helium might also be used. Use of ozone and oxygen is satisfactory during the ramp down period since the deposited PSG layer protects the underlying tungsten studs, lines, or other structures from oxidation. Depending on the choice of reactants, other layers, such as BPSG, undoped glass, and other boron or phosphate glasses could also be deposited according to this methodology. An important feature of the invention is to use a non-oxygen containing gas during both the pressurization and stabilization procedures of a CVD process.

Figure 5:
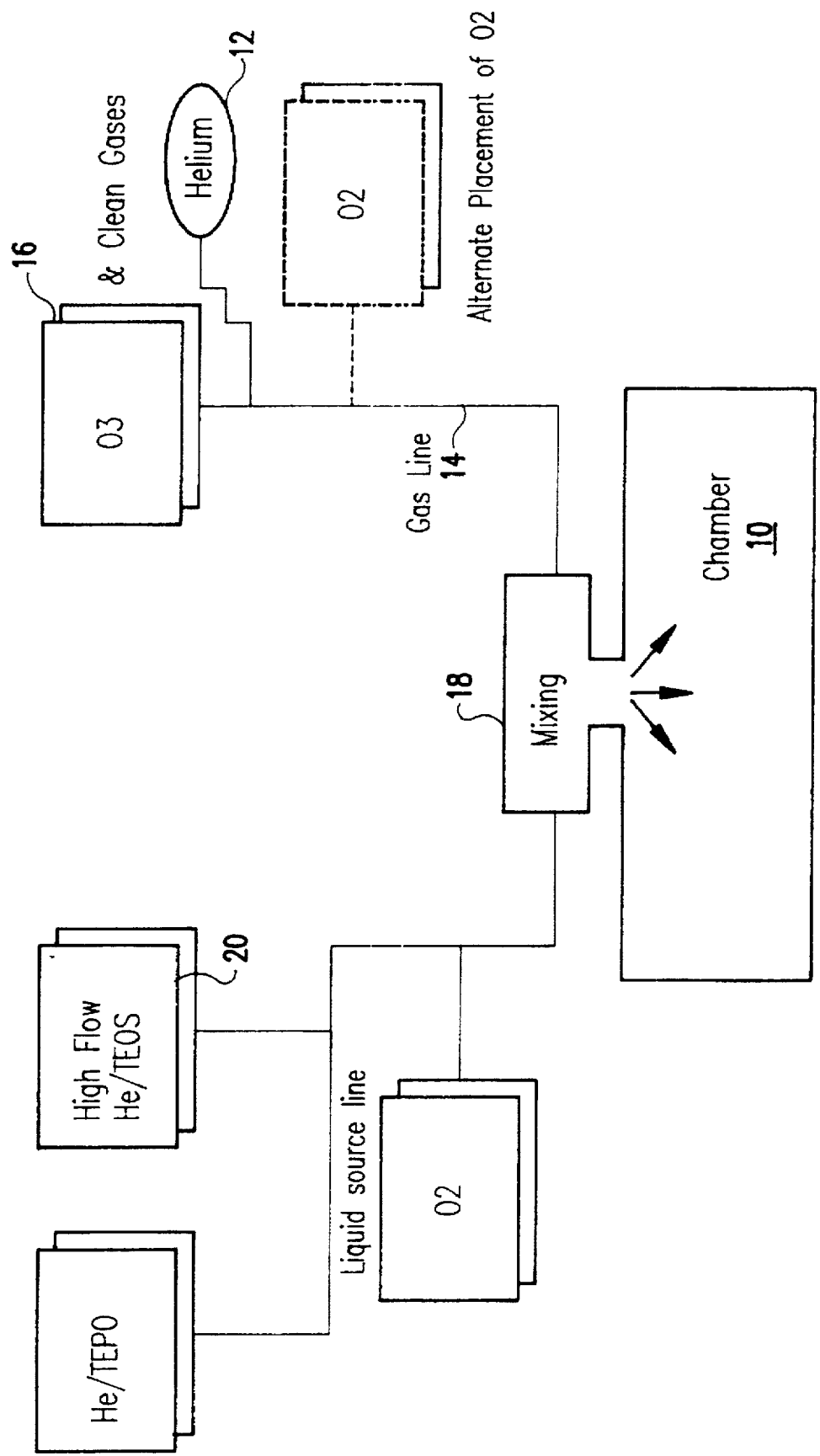
FIG. 5 is a schematic diagram showing a preferred embodiment of a hardware configuration for a SACVD process illustrating two separate modes of introducing helium into the deposition chamber for both pressurization and stabilization.

FIG. 5 shows a schematic diagram of the preferred SACVD process described above, and shows that the helium or other inert gas can be introduced into the deposition chamber 10 for the purposes of pressurization and stabilization by two different methods. Of course, other methods for introducing helium for pressurization and stabilization may also be used. First, an inert gas source 12 can be hooked up to the gas line 14. The gas line 14 would then be used to introduce ozone 16 and other gases into chamber 10 through mixing block 18. Alternatively, helium, or another inert gas, can bypass the TEOS ampule 20, to flow into chamber 10 from the liquid source line. In either case, the TEOS from ampule 20 can then be stabilized.

While the present invention has been described in terms of its preferred embodiments, those skilled in the art will recognize that the invention can be practiced with modification within the spirit and scope of the appended claims.

We claim:

1. A method of eliminating the formation of tungsten oxides during chemical vapor deposition of a layer on a substrate containing tungsten, comprising the steps of:

inserting a substrate containing tungsten into a deposition chamber;

elevating the temperature in the deposition chamber containing the substrate which contains tungsten in excess of 400° C.;

pressurizing said deposition chamber with a non-oxygen containing inert gas to between 600 and 760 Torr; and after said pressurizing and said elevating of temperature of said deposition chamber into which said substrate has been inserted, the sequential steps of:

introducing a first reactant in said deposition chamber, stabilizing the pressure in said deposition chamber at a selected pressure between 600 and 760 Torr during said introducing step, then introducing an oxidant and a second reactant into said deposition chamber, and then depositing a layer on said substrate formed from said first and second reactants.

2. The method of claim 1 wherein said elevating step elevates the temperature in said deposition chamber to approximately 480° C.

3. The method of claim 1 wherein said first reactant is tetraethoxysilane.

4. The method of claim 1 wherein said second reactant is a dopant containing phosphorous or boron.

5. The method of claim 4 wherein said dopant is triethylphosphate.

6. The method of claim 1 wherein said oxidant is selected from the group consisting of ozone and oxygen.

* * * * *